United States Patent
Kitajima et al.

(10) Patent No.: US 7,425,765 B2
(45) Date of Patent: Sep. 16, 2008

(54) ZINC-ALUMINUM SOLDER ALLOY

(75) Inventors: Masayuki Kitajima, Kawasaki (JP); Tadaaki Shono, Kawasaki (JP); Ryoji Matsuyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 19 days.

(21) Appl. No.: 11/084,204

(22) Filed: Mar. 21, 2005

(65) Prior Publication Data
US 2006/0125105 A1 Jun. 15, 2006

(30) Foreign Application Priority Data
Dec. 15, 2004 (JP) ............................. 2004-362609

(51) Int. Cl.
*H01L 23/532* (2006.01)

(52) U.S. Cl. .................. 257/772; 257/765; 257/771; 257/E23.157; 228/183; 228/223; 228/262.51; 148/688; 148/701; 148/705; 148/441; 438/688

(58) Field of Classification Search ............... 257/772
See application file for complete search history.

(56) References Cited

U.S. PATENT DOCUMENTS 4,389,463 A * 6/1983 Smeggil et al. ............ 428/659
4,448,748 A * 5/1984 Radtke et al. ............... 420/514
6,109,510 A * 8/2000 Otsuka et al. .......... 228/262.51
6,148,515 A * 11/2000 Suzuki et al. ............. 29/888.06
6,563,225 B2 * 5/2003 Soga et al. ................... 257/782
6,715,667 B2 * 4/2004 Korischem et al. .......... 228/183
6,840,434 B2 * 1/2005 Clay et al. ................... 228/223

FOREIGN PATENT DOCUMENTS

| EP | 0 785 045 A1 | 7/1997 |
| JP | 9-201694 | 8/1997 |
| JP | 10-140307 | 5/1998 |
| JP | 2000-280066 | 10/2000 |

* cited by examiner

*Primary Examiner*—Sue A. Purvis
*Assistant Examiner*—Eduardo A. Rodela
(74) *Attorney, Agent, or Firm*—Westerman, Hattori, Daniels & Adrian, LLP.

(57) ABSTRACT

A high melting point solder alloy superior in oxidation resistance, in particular a solder alloy provided with both a high oxidation resistance and high melting point suitable for filling fine through holes of tens of microns in diameter and high aspect ratios and forming through hole filling materials, comprising a zinc-aluminum solder alloy containing 0.001 wt % to 1 wt % of aluminum and the balance of zinc and unavoidable impurities.

10 Claims, 5 Drawing Sheets

Zn-0.001Al (wt%)

20 μm
Zn-0.001Al (wt%)

20 μm
Zn-0.01Al (wt%)

20 μm
Zn-0.1Al (wt%)

20 μm
Zn-0.2Al (wt%)

20 μm
Zn-0.86Al (wt%)

20 μm
Zn-1.0Al (wt%)

20 μm
Zn-2.0Al (wt%)

ZINC-ALUMINUM SOLDER ALLOY

CROSS-REFERENCE TO RELATED APPLICATIONS

This application is based upon and claims the benefit of priority from the prior Japanese Patent Application No. 2004-362609, filed on Dec. 15, 2004 the entire contents of which are incorporated herein by reference.

BACKGROUND OF THE INVENTION

1. Field of the Invention

The present invention relates to a high melting point solder alloy superior in oxidation resistance, in particular a solder alloy provided with both a high oxidation resistance and high melting point suitable as a through hole filling material for forming through hole interconnects.

2. Description of the Related Art

In recent years, remarkable advances have been made in the integration and reduction of size of CPUs, memories, acceleration and angular velocity sensors, and other semiconductor devices. Further, advances in microelectromechanical systems (MEMS) have led to commercialization of products in new fields such as micromirrors combining optical switches, optical waveguides, and other optical devices and semiconductor devices.

In view of this, with the aim of further increasing the speed, improving the performance, reducing the size, and lightening the weight of devices, studies have been made on increasing the density of systems by stacking a plurality of 3D chips on silicon (Si) substrates, glass substrates ($SiO_2$ based etc.), or combinations of the two.

At this time, with conventional stacked mounting using wire bonding, there are limits to the shapes and numbers of the chips which can be stacked. Further, with structures stacking thin packages via interposers and connecting external leads of the individual packages, the limits on the number of stacked layers are greatly eased, but if the number of stacked layers is increased, the length of the interconnects between chips end up increasing.

As opposed to this, if forming through hole interconnects connected passing through a silicon substrate or other substrate, the limit on the number of stacked layers can be eliminated and the increase of the interconnect length can be avoided.

A silicon substrate or glass substrate can reduce the thermal stress and thermal strain between the chip and substrate since it has a coefficient of heat expansion close to the IC chip or other silicon functional chip mounted. Further, it is also advantageous for mounting a CPU or other chip accompanied with a large heat emission due to the high heat conductivity.

Further, even with a single silicon device with no stacking, for example, even with a device such as an image sensor where it is desired to make the effective area of the detector as large as possible, the package size can be greatly reduced by taking out the terminals at the back of the substrate by through hole interconnects.

To make such through hole interconnects, through holes are filled with electroconductive materials. In the past, electroconductive paste has been widely used as a through hole filling material (for example, Japanese Unexamined Patent Publication (Kokai) No. 2000-138432, Japanese Unexamined Patent Publication (Kokai) No. 2000-138434, and Japanese Unexamined Patent Publication (Kokai) No. 2000-219811), but the fillable through hole aspect ratio is limited to about 2. However, when increasing the speed, improving the performance, reducing the size, and lightening the weight as in recent years, it is necessary for example to form through holes of opening diameters of 20 to 60 μm through thicknesses of 300 μm, so the aspect ratio of the through holes reaches as high as 5 to 15. For through holes of such small diameters and large aspect ratios, use of electroconductive paste containing electroconductive particles of sizes on the order of several μm is impossible in practice in view of the insufficiently small size of the electroconductive particles with respect to the opening diameter and the insufficient fillable aspect ratio.

As opposed to this, the method of filling a copper (Cu)-based material by electroless plating+electroplating is also being tried out (Kazuo Kondo et al., "Hole Filling Copper Plating for High Aspect Ratio Through Electrodes Used for 3D Mounting", *Journal of the Institute of Electronics*, vol. 6, no. 7, November 2003 (537-630), p. 596 to 601). This can also handle through holes with large aspect ratios. However, there are the defects that not only is a long time required for filling the through holes, but also copper is poor in bondability with the aluminum (Al) of the secondary interconnects since it is easily oxidizable.

Further, methods using iridium (In) alone, tin (Sn) alone, and gold (Au)-tin (Sn) solder alloys are also being studied (Tatsuo Suemasu et al., "High Aspect Ratio Through Interconnects Formed in Silicon Substrates", *Fujikura Technical Reports*, no. 102, April 2002, pp. 53 to 57). However, these have low melting points of less than 300° C., so there is the defect that an anodic bonding processing raising the temperature to over 380° C. at the least cannot be applied for silicon/silicon bonding and glass/silicon bonding.

SUMMARY OF THE INVENTION

An object of the present invention is to solve the problems of the related art and provide a high melting point solder alloy with a superior oxidation resistance, in particular a solder alloy provided with both the high oxidation resistance and high melting point suitable for filling fine through holes with diameters of tens of μm and high aspect ratios to form through hole interconnects.

To attain the above object, the present invention provides a zinc-aluminum solder alloy comprised of 0.001 wt % to 1 wt % of aluminum and a balance of zinc and unavoidable impurities.

The zinc-aluminum solder alloy of the present invention can secure a high melting point due to the zinc and realize a high oxidation resistance due to the addition of the aluminum by using the range of composition defined above.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Figure 1:
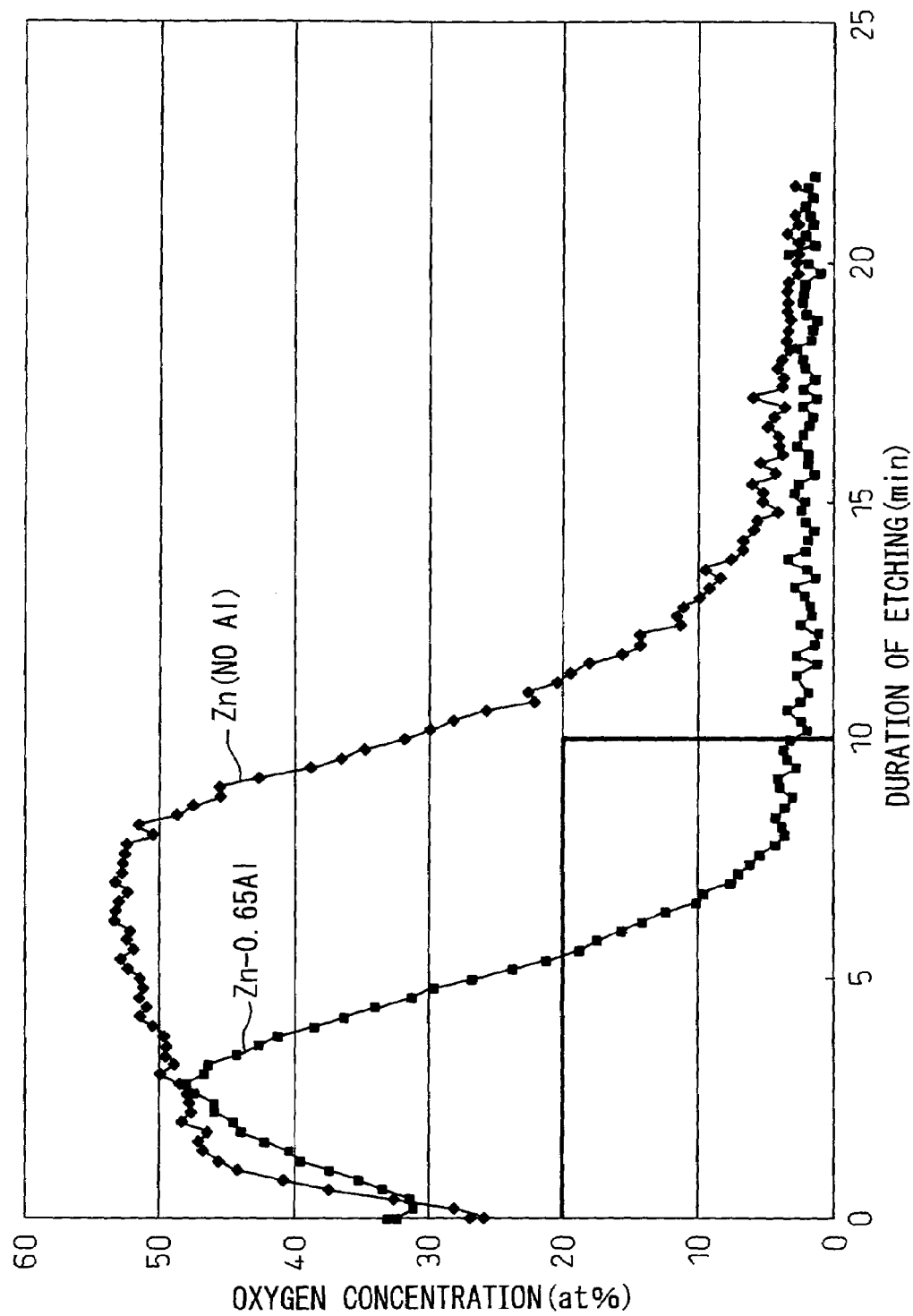
FIG. 1 is a graph of the relationship between the duration of etching and oxygen concentration in Auger analysis for Zn alone, outside the scope of the present invention, and a zinc-aluminum alloy of the present invention.
Figure 2:
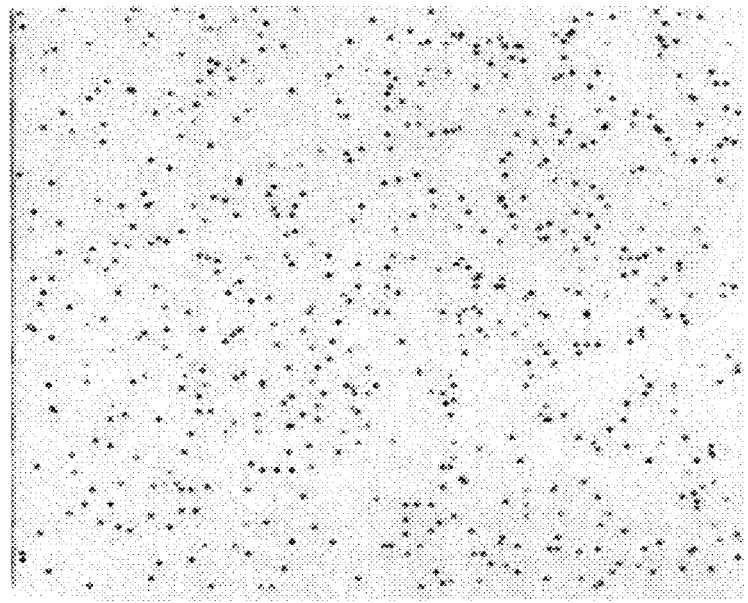
FIG. 2 is an EPMA photograph showing an aluminum deposited phase of a Zn-0.001 wt % Al solder alloy according to the present invention.
Figure 3:
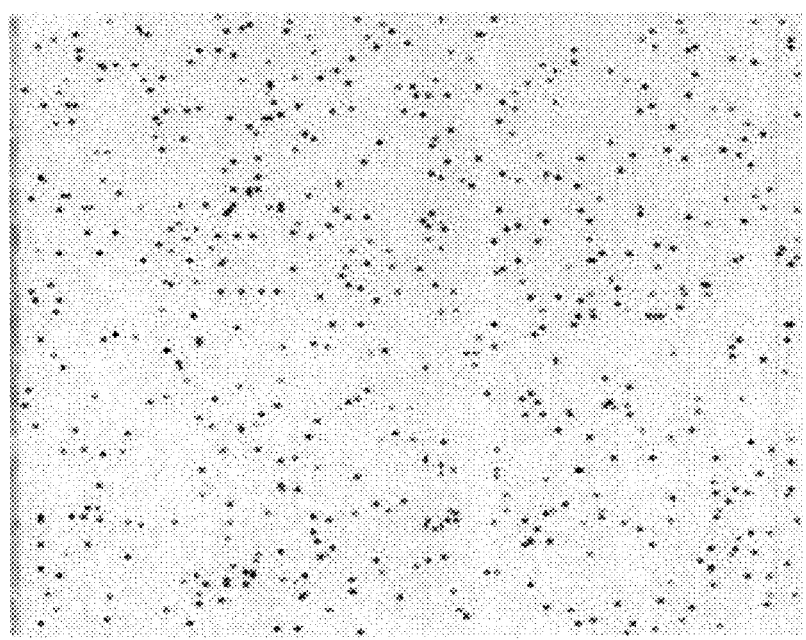
FIG. 3 is an EPMA photograph showing an aluminum deposited phase of a Zn-0.01 wt % Al solder alloy according to the present invention.
Figure 4:
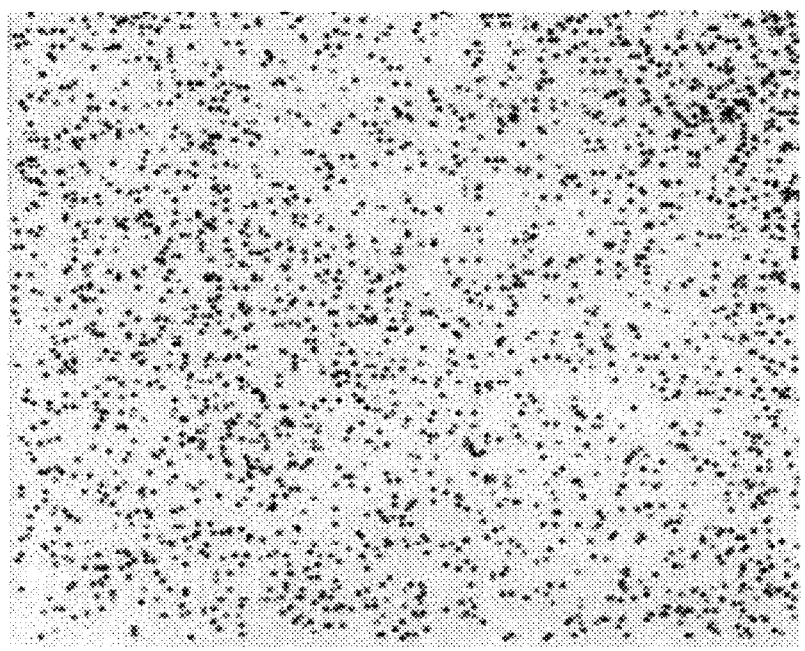
FIG. 4 is an EPMA photograph showing an aluminum deposited phase of a Zn-0.1 wt % Al solder alloy according to the present invention.
Figure 5:
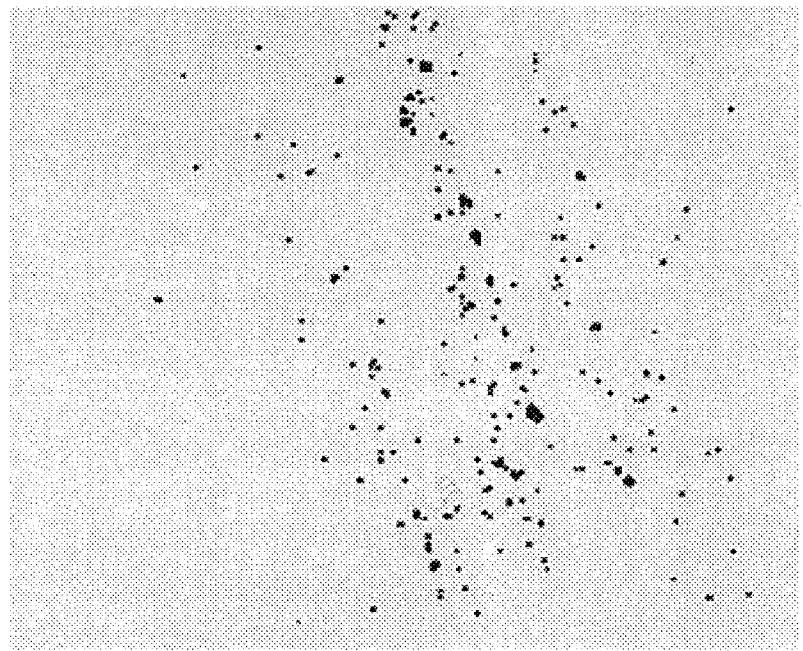
FIG. 5 is an EPMA photograph showing an aluminum deposited phase of a Zn-0.2 wt % Al solder alloy according to the present invention.
Figure 6:
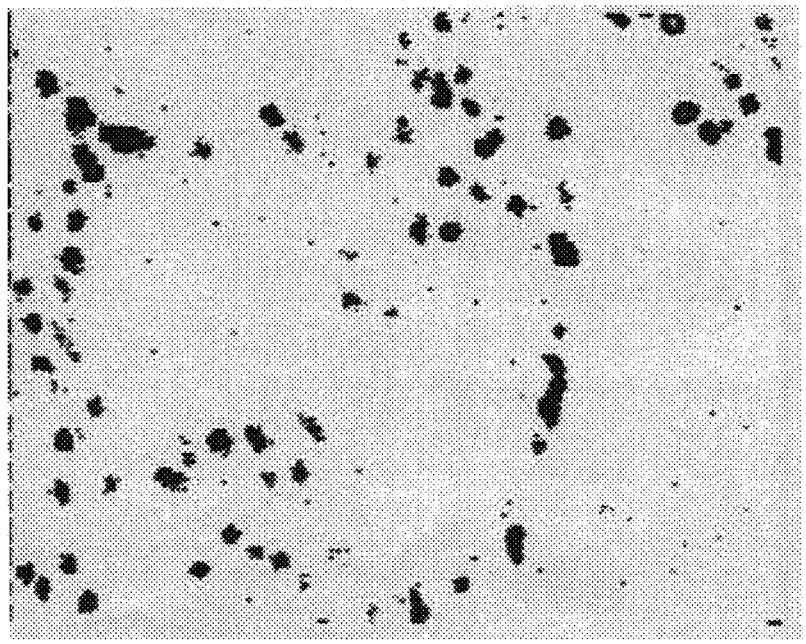
FIG. 6 is an EPMA photograph showing an aluminum deposited phase of a Zn-0.86 wt % Al solder alloy according to the present invention.
Figure 7:
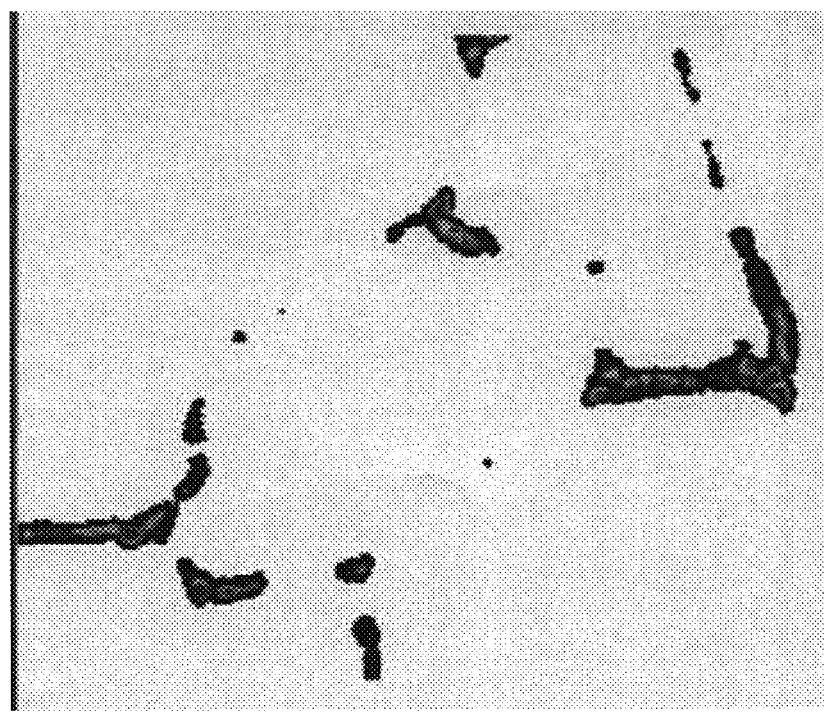
FIG. 7 is an EPMA photograph showing an aluminum deposited phase of a Zn-1.0 wt % Al solder alloy according to the present invention.

The reasons for limiting the aluminum content in the zinc-aluminum solder alloy of the present invention to the range of 0.001 wt % to 1 wt % will be explained below.

<Reason for Limiting Lower Limit of Aluminum Content to 0.001 wt %>

The solder alloy of the present invention has to be able to maintain the through hole interconnects stable even at a high temperature of over 380° C. at the time of the anodic bonding process as a through hole filling material. Zinc has a melting point of 419° C. so sufficiently meets this requirement. On the other hand, however, zinc has a low oxidation resistance and a susceptibility to formation of a surface oxide film, so is poor as a through hole interconnect in bondability with the aluminum secondary interconnects on the substrate. In the present invention, by adding 0.001 wt % or more of aluminum to zinc, a high oxidation resistance enabling a good bondability with aluminum secondary interconnects to be sufficiently secured is realized. Therefore, the zinc-aluminum solder alloy of the present invention has to contain at least 0.001 wt % of aluminum.

<Reason for Limiting Upper Limit of Aluminum Content to 1 wt %>

The solid solubility limit of aluminum in zinc is small, so if making a molten zinc-aluminum alloy solidify, generally the result is a solidified structure comprised of a zinc matrix in which aluminum (or aluminum-zinc compounds) is deposited. However, the solidification in fine through holes of diameters of tens of μm formed in a silicon substrate or glass substrate becomes rapid solidification since the fine columns are cooled by direct contact with the substrate solid from its entire circumference, so if the aluminum content is small, the state of the aluminum dissolved in the zinc will be frozen up to room temperature, whereby a homogeneous structure with aluminum dissolved in a supersaturated state without depositing is obtained.

The zinc-aluminum solder alloy of the present invention goes through various processes after being formed with the through hole interconnects, so is subjected to various loads due to factors such as exposure to thermal stress based on the difference in heat expansion with the substrate.

The alloy under the load has an even state of stress overall if the microstructure is a homogeneous structure comprised of only a single phase, but if there are a plurality of coexisting phases, stress easily concentrates at the phase interface, so cracks easily occur due to peeling at the phase interface. The tendency for cracking due to peeling at the phase interface becomes particularly marked when the phase interface continues long and divides the matrix.

If the zinc-aluminum alloy of the present invention forming the through hole interconnects is a microstructure of a plurality of coexisting phases comprised of a zinc matrix in which an aluminum deposited phase is present, the possibility will arise of cracks occurring due to the concentration of stress at the phase interface. In particular, if the aluminum content increases and exceeds 1 wt %, the aluminum deposited phase will form a continuous 3D mesh structure and divide the zinc matrix and cracks will easily occur. To prevent the formation of an aluminum deposited phase of such a 3D mesh structure, the aluminum content is made less than 1 wt % in the zinc-aluminum solder alloy of the present invention.

Further, the aluminum deposited phase is preferably as small as possible and high in uniformity of the distribution. From this viewpoint, the aluminum content is preferably not more than 0.86 wt %, more preferably not more than 0.3 wt %, most preferably not more than 0.1 wt %.

EXAMPLES

Example 1

Samples of various compositions of zinc-aluminum alloys changed in aluminum content in the range of 0 wt % to 2 wt %, including the range of the present invention, were prepared and were investigated as to their oxidation resistance and aluminum deposited phases. Along with this, they were measured for melting point and hardness. The sample preparation conditions and test methods were as follows:

[Sample Preparation Conditions]

Samples other than those for measuring the melting points were obtained by casting alloy melts of different compositions in the atmosphere from 600° C. into 10 mm×10 mm×10 mm carbon steel molds.

The samples for measuring the melting points were prepared by machining them to the predetermined dimensions prescribed for the measurement apparatuses.

[Oxidation Resistance]

Auger analysis was conducted in the depth direction from the surfaces of the samples as cast (cast skins). The samples were etched by argon ion sputtering. The duration of etching required for the oxygen concentration to be reduced to less than 20 at % was measured. The thicker the oxide film, the longer the required duration of etching. If an oxide film of a thickness of a duration of etching over 10 minutes is produced, the bondability with aluminum reinterconnects deteriorates, so a duration of etching of within 10 minutes was made the range of the present invention.

As the Auger analysis system, a Physical Electronics Inc. FE-SAM Model 1680 was used. The etching rate was about 1 nm/min converted to the case of $SiO_2$.

[Examination of Aluminum Deposited Phase]

Cut polished surfaces of the samples were mapped for the state of distribution of aluminum by an electron probe microanalyzer (EPMA). Samples where the aluminum deposited phases formed continuous mesh structures were judged as failing.

[Measurement of Melting Point]

A differential scan calorimeter was used and the peak temperature of the output chart was used as the melting point.

[Measurement of Hardness]

The cut polished surfaces of the samples were measured by a Vickers hardness meter. An Akashi Seisakusho hardness tester MVK-H1 was used at a pressing load of 100 g and a pressing time of 15 seconds.

The obtained results are shown in Table 1.

TABLE 1

| Class | Aluminum content (wt %) | Oxidation resistance (*1) | Aluminum deposited phase (*2) | Melting point (° C.) | Hardness (Hv) |
|---|---|---|---|---|---|
| Out of scope | 0 | P (>10) | — | 424.3 | 38.20 |
| In scope of invention | 0.001 | G (≦10) | Dispersed microparticles | 426.6 | 37.86 |
| | 0.003 | G (≦10) | Dispersed microparticles | 422.5 | 37.84 |
| | 0.005 | G (≦10) | Dispersed microparticles | 433.4 | 33.26 |
| | 0.008 | G (≦10) | Dispersed microparticles | 424.6 | 37.86 |
| | 0.01 | G (≦10) | Dispersed microparticles | 423.3 | 40.64 |
| | 0.05 | G (≦10) | Dispersed microparticles | 425.6 | 41.38 |
| | 0.1 | G (≦10) | Dispersed microparticles | 421.6 | 41.54 |
| | 0.2 | G (≦10) | Dispersed fine particles | 418.9 | 54.38 |
| | 0.3 | G (≦10) | Dispersed fine particles | 418.7 | 55.66 |
| | 0.4 | G (≦10) | Scattered grains | 418.5 | 61.28 |
| | 0.65 | G (≦10) | Scattered grains | 416.4 | 61.78 |
| | 0.86 | G (≦10) | Scattered grains | 415.0 | 63.68 |
| | 1 | G (≦10) | Scattered flakes | 412.9 | 65.30 |
| Out of scope | 2 | G (≦10) | Continuous mesh | 382.6 416.4 | 62.70 |

(*1) Parentheses indicate duration of argon etching (minutes) from sample surface until oxygen concentration becomes less than 20 at % by Auger analysis. 10 minutes or less indicates passed (G (Good)), while over 10 minutes indicates failed (P (Poor)).
(*2) Dispersed microparticles: Particles of diameters of less than 1 μm uniformly dispersed over the entire surface
Dispersed fine particles: Particles of diameters of less than 5 μm unevenly dispersed
Scattered grains: Particles of diameters of 5 μm to 10 μm unevenly scattered
Scattered flakes: Flakes of widths of several μm and lengths of less than 30 μm unevenly scattered
Continuous mesh: Continuous phase of width of several μm forming mesh structure <Evaluation>

[Oxidation Resistance]

As shown in Table 1, in the case of an aluminum content of 0 wt % (=zinc alone), the duration of etching where the oxygen concentration detected in the Auger analysis becomes less than 20 at % exceeds 10 minutes, the surface is covered by a thick oxide film, and the bondability with the aluminum secondary interconnects is stably secured.

As opposed to this, when the aluminum content is more than 0.001 wt %, the duration of etching becomes less than 10 minutes and the surface oxide film becomes thin, so the bondability with the aluminum secondary interconnects can be stably secured.

FIG. 1 shows an example of the results of measurement of the oxygen concentration in the depth direction by Auger analysis for samples with no aluminum added (=zinc alone) and with an aluminum content of 0.065 wt % as representative examples. The abscissa in the figure indicates the duration of etching (minutes), while the ordinate indicates the oxygen concentration (at %).

In the figure, the curve 1 shows the profile of distribution of the oxygen concentration of a sample of an aluminum content of 0 wt % (=zinc alone). It is learned that with a duration of etching of 10 minutes, the oxygen concentration is a high 30 at % and a thick oxide film covers the surface.

As opposed to this, curve 2 in the figure shows the profile of distribution of the oxygen concentration of a sample of an aluminum content of 0.65 wt %. The oxygen concentration drops to 20 at % by a duration of etching of 5 minutes. Compared with zinc alone (curve 1), the thickness of the oxide film drops to less than half.

If the aluminum content is more than the lower limit of the present invention of 0.001 wt %, a sufficient oxidation resistance for securing a good bondability with aluminum secondary interconnects is obtained.

[Aluminum Deposited Phase]

The phase will be explained with reference to the metal structure photographs of FIGS. 2 to 7 along with Table 1.

Figure 8:
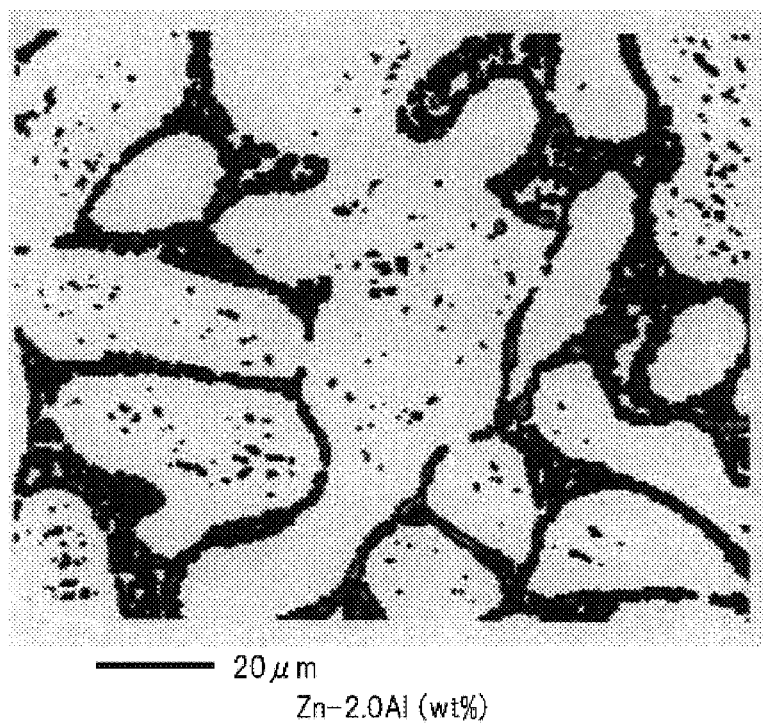
FIG. 8 is an EPMA photograph showing an aluminum deposited phase of a Zn-2.0 wt % Al solder alloy according to the present invention.

With an aluminum content up to 1 wt %, the aluminum deposited phase is generated as a small discontinuous phase. However, the form of the aluminum deposited phase changes in steps by the aluminum content. That is, the forms of the aluminum deposited phase are (1) dispersed microparticles of less than 1 μm size with an aluminum content of 0.001 wt % to 0.1 wt % (FIG. 2 to FIG. 4), (2) dispersed fine particles of less than 5 μm size with an aluminum content of more than 0.1 wt % to 0.3 wt %, (3) scattered grains of 5 to 10 μm size with an aluminum content of more than 0.3 wt % to 0.86 wt %, and (4) scattered flakes of widths of several μm and lengths of less than 30 μm with an aluminum content of 1.0 wt %. None of these have long continuous phase interfaces, so all are resistant to cracking due to interfacial peeling. The definitions of the forms (1) to (4) of the aluminum deposited phases are as follows:

(1) Dispersed microparticles: Particles of diameters of less than 1 μm uniformly dispersed over the entire surface (2) Dispersed fine particles: Particles of diameters of less than 5 μm unevenly dispersed (3) Scattered grains: Particles of diameters of 5 μm to 10 μm unevenly scattered (4) Scattered flakes: Flakes of widths of several μm and lengths of less than 30 μm unevenly scattered As opposed to this, in a sample with an aluminum content of 2 wt %, over the 1 wt % of the upper limit of the present invention, the aluminum deposited phase forms a continuous mesh structure (FIG. 8) and divides the matrix. Cracks easily occur due to peeling at the phase interface. Note that the above continuous mesh structure is a state where a continuous phase of a width of several μm forms a mesh structure.

Therefore, if the aluminum content is less than the upper limit of 1 wt % of the present invention, the aluminum deposited phase does not form a continuous mesh structure, so it is possible to make more difficult the occurrence of cracks of the through hole interconnects due to thermal stress etc. in the process of raising and lowering the temperature in the steps after filling the through holes, that is, after formation of the through hole interconnects.

Further, the aluminum deposited phase is preferably as small as possible and high in uniformity of distribution, so the aluminum content is preferably less than 0.86 wt % (scattered grains as opposed to scattered flakes), more preferably less than 0.3 wt % (dispersed fine particles as opposed to scattered grains), most preferably less than 0.1 wt % (dispersed microparticles as opposed to dispersed fine particles).

[Melting Point]

If within the range of the aluminum content of the present invention, a high melting point sufficiently over the 380° C. required for anodic bonding is obtained. That is, in the range of the aluminum content of 0.001 wt % to 1 wt % of the present invention, the melting point drops monotonously from 426.6° C. to 412.9° C. along with an increase in the aluminum content, but even the minimum value of 412.9° C. is sufficiently above the 380° C. required for anodic bonding.

Note that at an aluminum content of 2 wt % outside the range of the present invention, the solder alloy enters a eutectic state, but a eutectic temperature of 382.6° C. on a solid phase line of a fixed temperature regardless of the composition and a liquid phase line of 416.4° C. changing along with the composition are observed.

[Hardness]

If within the range of the aluminum content of the present invention, the hardness gradually increases along with the increase in the aluminum content from the lower limit to the upper limit, but the highest value of the hardness, at 1 wt % of the aluminum content, is Hv 65.30. The problem of embrittlement due to excessive hardening does not occur.

Example 2

The zinc-aluminum solder alloy of the present invention was used to fill through holes.

(1) Formation of Through Holes

First, inorganic glass substrates (15 mm×15 mm×t300 μm) were etched to form through holes (opening diameters of 20 to 60 μm). The aspect ratios of the through holes were 5 to 15 (=300 μm/60 μm to 300 μm/20 μm).

(2) Pretreatment (2-1) Plating of Inside Walls of Through Holes

To improve the wettability of the through hole inside walls with the solder alloy, the through hole inside walls were electrolessly plated in order by nickel plating (thicknesses of 0.5 μm) and gold plating (thicknesses of 0.05 μm).

(2-2) Filling Flux into Through Holes

The thus plated substrates were immersed in soldering flux (made by Senju Kinzoku Kogyo, Sparkle Flux 408) and an ultrasonic cleaner used to apply ultrasonic vibration for 1 minute to fill flux into the through holes.

(3) Filling Solder into Through Holes

The thus pretreated glass substrates (no preheating) were gripped by tweezers and immersed in a molten bath of the solder alloy Zn-0.65 wt % aluminum of the present invention (melting point: 419° C.) held at 600° C. vertical to the bath surface in the atmosphere, held in the bath for 10 seconds, then lifted up.

(4) Examination of Results

Cross-sections of the through holes after filling with the solder alloy were examined by an optical microscope.

The fact that solder alloy was filled without gaps over the entire through holes was confirmed for all aspect ratios 5 to 15 tested (opening diameters of 60 μm to 20 μm). The through hole inside walls were completely coated by Ni/Au plating layers. The solder alloy was strongly bonded to the inside walls of the through holes via the coatings.

Example 3

Secondary interconnects made of aluminum were formed on the glass substrates with through holes filled with the solder alloy in Example 2.

The solder alloy through hole lands were exposed at the two sides of the glass substrates filled with the through holes. Aluminum films (thicknesses of 0.5 μm) were deposited on the two sides of the glass substrates. A Hitachi HUS-5G high vacuum evaporator was used for deposition by a vacuum degree of $10^{-5}$ Torr. After the deposition, the substrates were annealed for 150° C.×2 hours.

A Fluke 77 Multimeter was used to measure the conductive resistance between secondary interconnects of the two surfaces of the substrate. Due to this, conduction between the through hole lands and aluminum secondary interconnects was confirmed.

Summarizing the effects of the invention, the present invention solves the problems of the related art and provides a high melting point solder alloy with a superior oxidation resistance, in particular a solder alloy provided with both the high oxidation resistance and high melting point suitable for filling fine through holes with diameters of tens of μm and high aspect ratios to form through hole filling materials.

According to the present invention, it is possible to provide a solder alloy optimal for filling high aspect ratio through holes formed in semiconductor device materials such as silicon, lithium silicon, and glass substrates to form through hole interconnects and to further increase the speed, improve the performance, reduce the size, and lighten the weight of semiconductor devices and other electronic devices. Further, remarkable effects can be expected even in application to a microelectromechanical system (MEMS) using semiconductor production technology.

While the invention has been described with reference to specific embodiments chosen for purpose of illustration, it should be apparent that numerous modifications could be made thereto by those skilled in the art without departing from the basic concept and scope of the invention.

What is claimed is:

1. A zinc-aluminum solder alloy containing 0.001 wt % to 0.4 wt % of aluminum and a balance of zinc and unavoidable impurities.

2. A zinc-aluminum solder alloy as set forth in claim 1, wherein the content of aluminum is not more than 0.3 wt %.

3. A zinc-aluminum solder alloy as set forth in claim 1, wherein the content of aluminum is not more than 0.1 wt %.

4. A semiconductor device comprising:
   a zinc-aluminum solder alloy containing 0.001 wt % to 0.4 wt % of aluminum and a balance of zinc and unavoidable impurities.

5. The semiconductor device as set forth in claim 4, wherein the content of aluminum is not more than 0.3 wt %.

6. The semiconductor device as set forth in claim 4, wherein the content of aluminum is not more than 0.1 wt %.

7. A microeleetromechanical system comprising:
   a zinc-aluminum solder alloy containing 0.001 wt % to 0.4 wt % of aluminum and a balance of zinc and unavoidable impurities.

8. The microelectromechanical system as set forth in 7, wherein the content of aluminum is not more than 0.3 wt %.

9. The microelectromeehanical system as set forth in claim 7, wherein the content of aluminum is not more than 0.1 wt %.

10. A method for manufacturing a semiconductor device comprising:
    forming a through hole in a substrate, and filling the through hole with a zinc-aluminum solder alloy containing 0.001 wt % to 0.4 wt % of aluminum and a balance of zinc and unavoidable impurities.

* * * * *